US 6,671,098 B2

(12) United States Patent
Feldman

(10) Patent No.: US 6,671,098 B2
(45) Date of Patent: Dec. 30, 2003

(54) SCANNING ANGLE EXPANDER AND A METHOD FOR EXPANDING A SCANNING BEAM ANGLE

(75) Inventor: Haim Feldman, Nof Ayalon (IL)

(73) Assignee: Applied Materials, Inc., Santa Clara, CA (US)

(*) Notice: Subject to any disclaimer, the term of this patent is extended or adjusted under 35 U.S.C. 154(b) by 0 days.

(21) Appl. No.: 10/151,363

(22) Filed: May 16, 2002

(65) Prior Publication Data
US 2003/0214723 A1 Nov. 20, 2003

(51) Int. Cl.[7] .............................................. G02B 27/10
(52) U.S. Cl. ........................ 359/626; 359/621; 359/622
(58) Field of Search ................................. 359/205, 433, 359/621, 622, 626

(56) References Cited

U.S. PATENT DOCUMENTS

| 5,059,008 A | * 10/1991 | Flood et al. ................. 359/196 |
| 5,392,157 A | * 2/1995 | Shih ............................ 359/625 |
| 5,479,026 A | * 12/1995 | Schumtz et al. ............. 250/568 |
| 5,581,408 A | 12/1996 | Schumtz et al. ............. 359/622 |
| 5,612,821 A | 3/1997 | Schmutz ...................... 359/622 |
| 5,982,921 A | 11/1999 | Alumot et al. ............... 382/145 |
| 6,122,108 A | * 9/2000 | Tholl et al. .................. 359/619 |
| 6,248,988 B1 | 6/2001 | Krantz ....................... 250/201.3 |
| 6,262,423 B1 | 7/2001 | Hell et al. ................... 250/458.1 |

OTHER PUBLICATIONS

Nicholas F. Borrelli, "Microoptics Technology: Fabrication and Applications of Lens Arrays and Devices" Chapters 2 and 6 (published by Marcel Dekker, Inc. in 1999) pp 1–195.

* cited by examiner

Primary Examiner—David N. Spector
(74) Attorney, Agent, or Firm—Sughrue Mion LLP.

(57) ABSTRACT

A scanning angle expander that includes a converting optics for receiving an input beam, the input beam being inclined with respect with an optical axis of the converting optics by an input scan angle, and for converting the input beam to multiple output beamlets, each output beamlet being inclined with respect to the optical axis of the converting optics by an output scan angle; and expanding optics, for converting the multiple output beamlets to an output beam that is substantially parallel to the output beamlets, whereas the output beam and the input beam have substantially a same size.

38 Claims, 3 Drawing Sheets

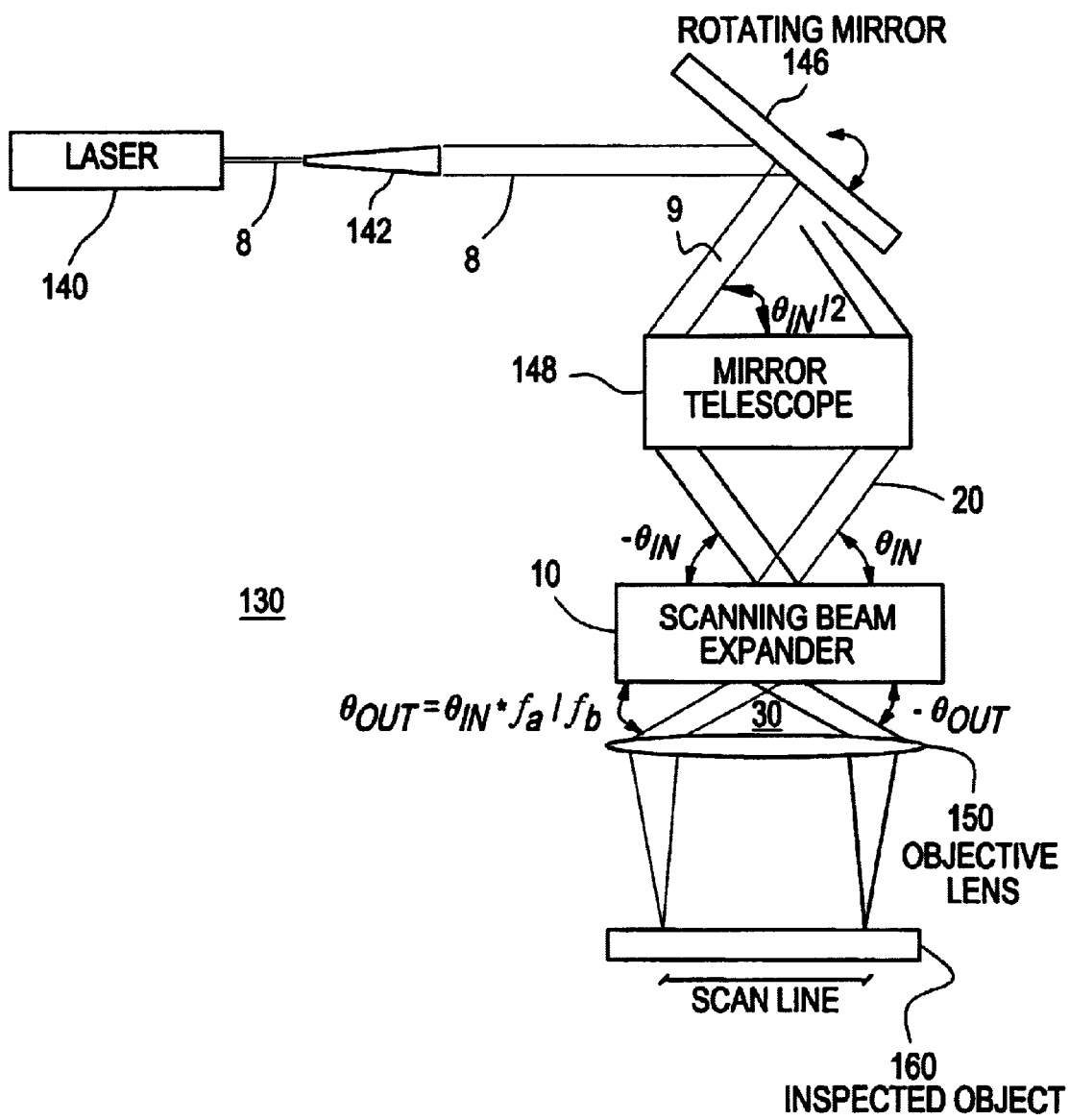

SCANNING ANGLE EXPANDER AND A METHOD FOR EXPANDING A SCANNING BEAM ANGLE

BACKGROUND OF THE INVENTION

1. Field of the Invention

The present invention relates to a scanning angle expander for expanding the angular extent of a scanning system of the type used in optical inspection equipment and more particularly to an scanning angle expander of the type used to inspect semiconductor wafers and the like. The invention is particularly useful for optically scanning patterned semiconductor wafers used in producing integrated-circuit dies or chips, and the invention is therefore described below particularly with respect to this application. The present invention more particularly relates to a scanning angle expanding device that increases the scanning angle of an optical scanner while maintaining a same beam diameter for the input and output optical beams of the scanning device.

2. Description of the Related Art

The inspection of semiconductor wafers is typically performed by scanning a laser beam across a wafer's surface and collecting light scattered therefrom. The scanning operation is conducted by scanning the laser beam across the wafer surface in a first direction using one of a variety of known deflectors, such as acousto-optic deflectors or electromechanical deflectors, while moving a stage that supports the wafer thereon in a second direction, that is typically orthogonal to the first direction.

There are various devices and methods for scanning a laser beam, such as acousto-optic devices, electromechanical deflectors, and the like. There is a greater emphasis on the throughput of inspection device and accordingly on the throughput of scanners, as the design rules for semiconductors rapidly shrink without a corresponding decrease of the inspection sequence time period or the overall size of semiconductor dies or wafers.

A scanner is usually followed by a focusing unit that ideally focuses the scanned beam light to a spot onto the surface of the wafer. The focusing unit is characterized by its focusing abilities (which is commonly measured by its Numeric Aperture—NA) and the scanner is characterized by various parameters, such as its scan period and the angular extent of the scan. The resolution of the overall system (including the scanner and the focusing unit) is determined by the NA of the focusing unit and the size (or more particularly—the cross section) of the light beam that exits the scanner and enters the focusing unit. The resolution (also termed "spot size"—reflecting the size of light beam on the surface of the wafer—after being focused) is inversely proportional to the size of the scanned beam prior to being focused by the focusing lens.

It is known in the art that a mere increment of throughput may deteriorate the system's resolution. For example, the throughput may be incremented by increasing the angular extent of the scan while maintaining the same scan period. This increment may be achieved by passing a scanned beam through a telescope that includes an input lens having a first focal length F1 and an output lens having a second focal length F2 (whereas F2 is greater than F1). If the angular extent of the scan of the input beam is a first angle $\alpha 1$ then the angular extent of the scan of the output beam is $\alpha 2$, whereas $\alpha 2 = \alpha 1 * F2/F1$. Nevertheless, the throughput increment deteriorates the system resolution as the telescope also reduces the cross section of the scanned beam (in proportion to the ratio between F1 and F2) and eventually increases the spot size.

Another solution for increasing the scanner throughput (without decreasing the resolution) involves using larger electromechanical deflectors or larger acousto-optic deflectors for expanding the beam deflection angle of optical scanning systems, which opposes the general trend toward miniaturizing optical scanning devices. Furthermore, using larger deflectors suffer from low cost/performance ratio and are relatively very complex. For example, increasing the size of mechanical deflectors leads to an increase in their weight, reduced resonance frequescy and limit the scan speed. Increasing the size of an acousto-optic deflector requires more complex transducer configuration and drivers.

The invention described herein provides a solution for the above noted problems associated with increasing wafer inspection speeds.

SUMMARY OF THE INVENTION

The present invention enables to increase the throughput of a scanner without decreasing its resolution. The scanning angle expander enables the use of beam deflectors with small physical sizes.

In accordance with another feature of the present invention, the invention involves a scanning angle expander for expanding a scanning angle of an optical scanner, the system includes (i) a beam to multiple beamlets converter and angle conversion optics (also referred to as converting optics), and (ii) multiple beamlet expanding optics (also referred to as expanding optics). It is noted that a focusing optics is usually located between the scanning angle expander and the inspected object (such as a wafer).

The converting optics includes a microlens telescope that includes two microlens arrays (though other types of lenses may be utilized), whereas each microlens of the first microlens array corresponds to a microlens of a second microlens array. The ratio between the focal length of each pair of corresponding microlenses reflects the change between the incidence angle of an input beam that enters a first microlens and the incidence angle of an output beamlet that exits the corresponding microlens of the second microlens array.

The expanding optics converts the plurality of output beamlets to a single output beam having a diameter that is substantially equal to the diameter of the input beam, by performing manipulations in the frequency domain. Conveniently, the multiple output beamlets are provided to a first converging lens (a Fourier transform lens) that performs a Fourier transform of the multiple output beamlets, from the spatial domain to the frequency domain. In other words, the intensity of light at a Fourier plane located at a focal length of the Fourier transform lens reflects the frequency components of the light intensities of the multiple output beamlets that enter the Fourier transform lens.

The light intensity distribution of the multiple output beamlets has various frequency components, reflecting the distance between adjacent output beamlets, and the width of each beamlet. The frequency components are grouped in groups. One of the frequency components groups is a very low frequency component group, that preferably includes a Direct Current (zero frequency) component. The DC component is responsive to the average light intensity of the light intensity distribution. At the Fourier plane these frequency components are reflected by intensity peaks, starting from the lowest frequency component group that includes the DC component. Higher frequency component groups are spatially separated from the lowest frequency component group.

At the Fourier plane, frequency filtering schemes (such as low pass) may be implemented by using spatial filters. The expanding optics blocks (conveniently, by utilizing a spatial filter positioned at the Fourier plane) the high frequency component groups and passes the lowest frequency component group of the light signals to a second lens (inverse Fourier transform lens) that performs an inverse Fourier transform (from the frequency domain to the spatial domain) of the lowest frequency component group of the light signal. In other words, the intensity of light at an Inverse Fourier plane located at a focal length of the inverse Fourier transform lens is a single beam, reflecting an inverse Fourier transform of the lowest frequency component group. Thus, the expanding optics output a single output beam, having substantially the same diameter as the input beam, but oriented at a greater scan angle.

Other features of the present invention will become apparent from the following detailed description considered in connection with the accompanying drawings that disclose embodiments of the present invention.

BRIEF DESCRIPTION OF THE DRAWINGS

The foregoing and other objects, features, and advantages of the present invention will become more apparent from the following detailed description when taken in conjunction with the accompanying drawings. In the drawings, similar reference characters denote similar elements throughout the different views, in which:

FIG. 3 illustrates a portion of an optical inspection system that includes the scanning angle expander, in accordance to an embodiment of the invention.

DETAILED DESCRIPTION OF THE PREFERRED EMBODIMENTS

Reference will now be made in greater detail to exemplary embodiments of the present invention. In the following description made in conjunction with the exemplary embodiments of the present invention, a variety of specific elements are described. The following detailed description is of exemplary embodiments of the invention but the invention is not limited thereto, as modifications and supplemental structures may be added, as would be apparent to those skilled in the art. Also, in the following description of the present invention, a detailed description of known functions and configurations incorporated herein is omitted.

In particular, but without limitation, while an exemplary embodiment may be disclosed with regard to the inspection of a specimen surface by detecting reflected light using a light source and detecting unit that are disposed on a common side of a specimen (a "reflective system"), it would be readily apparent to one skilled in the art that the teachings are readily adaptable to the inspection of a specimen by detecting transmitted light with a detecting unit that is on a side of a specimen opposite to that of the light source (a "transmissive system"). While the reflective system and the transmissive system differ, for one example by the absence of a beam splitter in the transmissive system, the principles of the present invention are applicable to both types of systems. As would be understood by one skilled in the art, both types of systems may be utilized separately or together in an inspection of a specimen.

Figure 1:
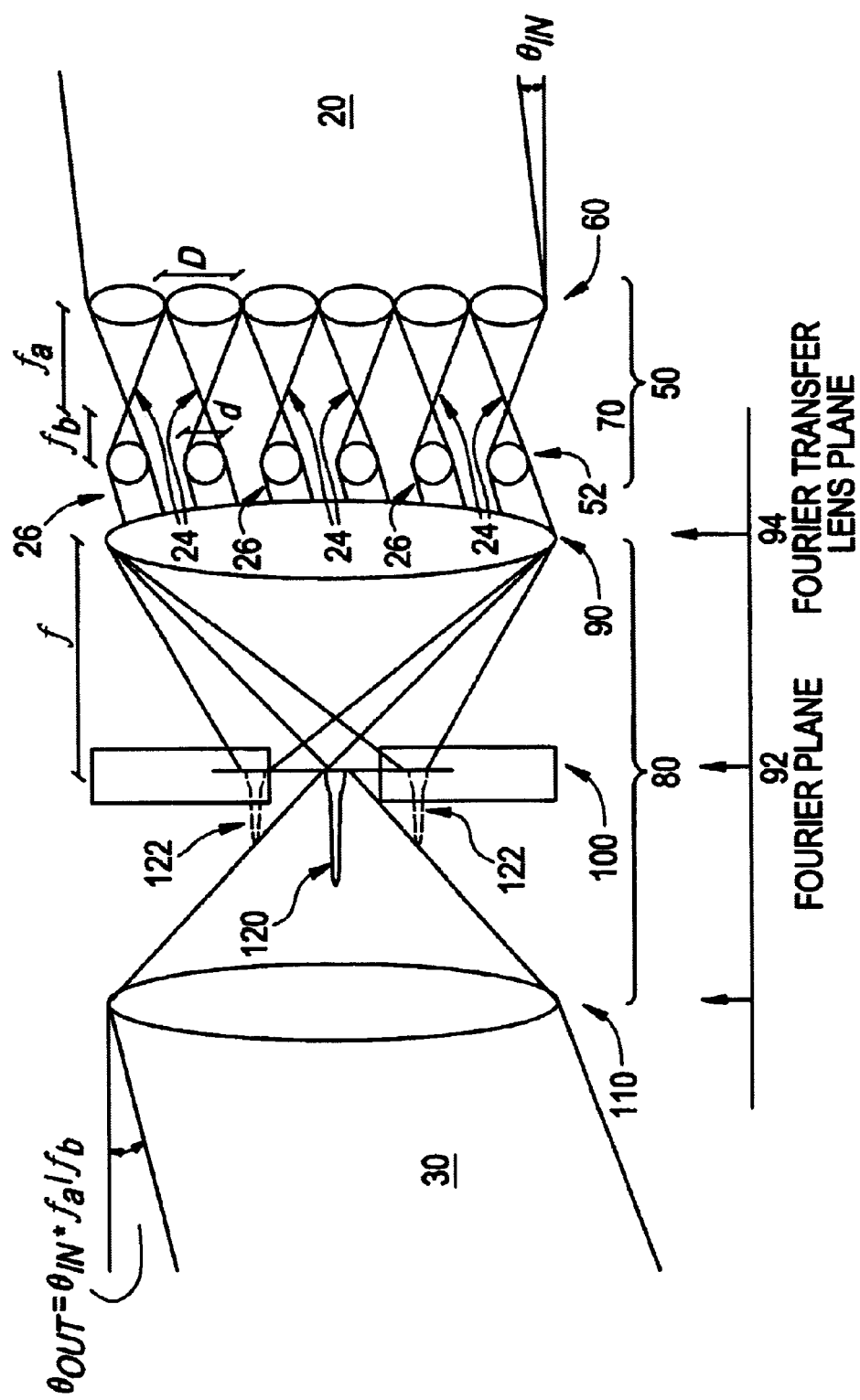
FIG. 1 illustrates an exemplary embodiment of the scanning angle expander, in accordance to an embodiment of the invention.

FIG. 1 illustrates an exemplary embodiment of a scanning angle expander 10 that receives input beam 20 and adjusts a scanning angle of the input beam 20 while maintaining a same beam diameter for the output beam 30. The scanning angle expander 10 includes converting optics 50 and expanding optics 80.

Converting optics 50 includes a micro-lens telescope 52 as a first light receiving element for receiving the input beam 20 having a beam diameter L from an external source (not shown). Microlens telescope 52 may be implemented in various manners, one being illustrated at FIG. 1. Microlens telescope 52 may include a first microlens array 60 that is parallel to a second microlens array 70, whereas all the microlenses of the first microlens array have the same focal length ("first focal length"), while all the microlenses of the second microlens array 70 have the same focal length ("second focal length"), which differs from the first focal length. The first and second microlens arrays are spaced apart by the sum of the first and second focal length such that the beamlets that exit the first microlens array (also referred to first beamlets 24) substantially fill the whole pupil of the microlenses of the second microlens array 70. It is noted that each microlenses array may be arranges as two-dimensional grids, but this is not necessarily so. For example, each microlens array may be arranges in a row and/or in a column. The size of each microlens array is responsive to the size of each of its microlenses and the system resolution, as better resolution may be achieved by larger amounts of microlenses. A single microlens array includes few microlenses but even much larger microlenses arrays that include millions of microlenses, may be utilized. Typically, a microlens array includes thousands of microlenses. Conveniently, one-dimensional scanning schemes are implemented by microlens arrays that include column of cylindrical microlenses that do not substantially effect the transverse properties of the input beam. A two dimentional microlens array is utilized for two-dimensional scanning schemes, although this is not necessarily so.

According to another embodiment of the invention not all microlenses of the first microlens array 60 have the same focal length. In order to achieve a uniform deflection of the output beamlets that exit the microlens telescope 52 (these beamlets are also referred to a second beamlets 26), it is desired to maintain a constant ratio between the focal length of a microlens of the first microlens array 60 and a corresponding microlens of the second microlens array 70. It is noted that multiple focal lengths may be required when the microlenses array are curved, or have planar and non-planar portions first Referring again to FIG. 1, illustrating a cross section of microlens telescope 52, that includes two dimensional microlens arrays. Each microlens of the first microlens array 60 had a first diameter D and a first focal length $f_a$. The first microlens array 60 is positioned in a first plane and divides the input beam 20 into first beamlets 24 to generate an array of spots at their respective focal points. In the present embodiment, it is contemplated that each of the microlenses of the first microlens array 60 has a same focal length, but it is within the scope of the present invention that they may have different focal lengths. For example, the plurality of the microlenses array (either the first or the second) may be arranged in a curved array or in an array having planar and non-planar portions, whereas the ratio between the focal length of a microlens of the first microlens array and between the focal length of a corresponding microlens of the second microlens array is constant. It is further noted that although the microlenses of FIG. 1 have a diameter of D, they may be shaped in various shapes. For example, the first array of microlenses 60 may include a single row of ellipsoid shaped microlenses, each microlens having a width of L and a height of D, while the second microlenses 70 may include a single row of ellipsoid shaped microlenses, each microlens having a width of L and a height of d.

Each microlens of the second microlens array 70 has a second diameter d and a second focal length $f_b$. The second microlens array is positioned in a second plane and outputs output beamlets 26 that are inclined with respect to the optical axis of microlens telescope 52 by an angle of $\theta_{OUT}$, whereas $\theta_{OUT}=f_a/f_b \; \theta_{IN}$, and $\theta_{IN}$ is the inclination angle of the input beam 20 $\theta_{IN}$ with respect to the optical axis of the microlens microscope, $f_a$ and $f_b$ are the focal lengths of the microlenses that belong to the first and second microlens arrays, respectively.

The second beamlets exit microlens telescope 52 and enter expanding optics 80. Expanding optics 80 includes: (i) Fourier transform lens 90 that is located adjacent to the second microlens array 70 and is adapted to receive the output beamlets 26, (ii) a spatial filter 100 that is positioned in a Fourier plane of the Fourier transform lens and, (iii) an inverse Fourier lens 110 that is positioned in an inverse Fourier plane.

Fourier transform lens 90 is a positioned at a Fourier transform lens plane 92 and is a positive converging lens that contains an inherent ability to perform a Fourier transformation that converts a spatial distribution of the light intensities (substantially of the output beamlets 26) at the Fourier transform lens plane 92 to a frequency domain representation of the spatial representation, at the Fourier plane 94. The Fourier plane 94 includes the focal point of the Fourier transform lens 90.

At the Fourier plane frequency component manipulations, such as low pass, band-pass, high pass, are implemented by spatial filtering, as the frequency components of the spatial distribution of light intensity at the Fourier lens plane 92 are spaced apart in response to their frequency. The frequency distribution is characterized by low frequency components, and high frequency components. It is known in the art that the inverse Fourier transform of the DC component results in a substantially smooth pulse-shaped/bell-shaped, Arie-shaped or even Gaussian-shpaed light intensity distribution. In order to pass the DC component and block higher frequency components, the spatial filter 100 includes a blocking portion 101 and an aperture 102 that passes the DC component.

Figure 2:
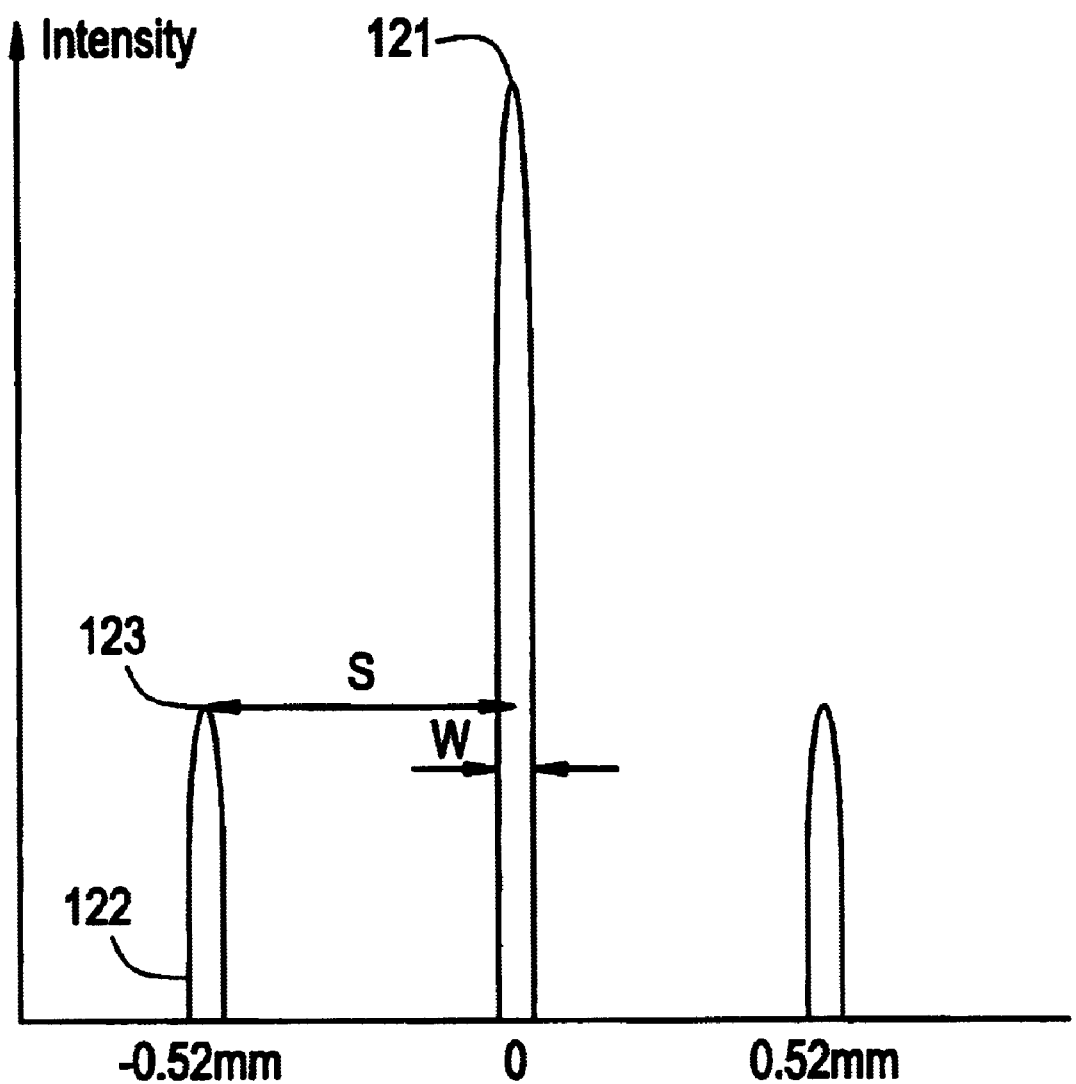
FIG. 2 illustrates an enlarged view of the intensity distribution shown at the focal point of the Fourier transform lens in FIG. 1.

FIG. 2 illustrates an exemplary intensity distribution at the Fourier plane 94 for a system having parameters D=50 $\mu$m, d=25 $\mu$m, N=20, $\lambda$=0.532 $\mu$m, and f=50 mm. Whereas D is the diameter is microlenses of the first microlens array 70, d is the diameter is microlenses of the second microlens array 80, N is the number of microlenses in each microlens array out of the first and second microlens arrays 70 and 80, $\lambda$ is the wavelength of input beam 20 and f is the focal length of Fourier transform lens 90. FIG. 2 shows W to be the width of the lowest frequency component group 120 and S to be the separation between the lowest frequency component peak 121 and the peak 123 of the second lowest frequency component group 122.

The aperture 102 of spatial filter 100 is calculated based on the values W, S and $\Delta$. $\Delta$ represents the maximal spatial shift of the lowest frequency component group in response to the changes in the inclination angle between output beamlets 26 and the optical axis of converging optics 50. In other words, assuming that the angle of the light beam exiting microlens telescope 52 is periodically changed during the scan within a range of $[-\theta_{IN}, +\theta_{IN}]$, the inclination angle of the output beamlets 26 are within a corresponding range of $[-(f_a/f_b \; \theta_{IN}), +(f_a/f_b \; \theta_{IN})]$. Accordingly, at the Fourier plane 94 this change corresponds to location shift within a range fo $[-\Delta/2, +\Delta/2]$, whereas $\Delta/2=(f_a/f_b\theta_{IN})*f$.

The aperture 102 is operable to: (i) block the higher frequency components (starting from second lowest frequency component group 122) positioned at a minimal distance of S from the lowest frequency component group peak 121), and (ii) transfer the lowest frequency component group 121 regardless of the inclination angle.

Throughout the specification the letters D and d are referred to as the diameter of microlenses within the first and second microlenses arrays, accordingly. It is noted that D and d actually describe the inverse pitch between two adjacent microlenses. Ideally, the diameter of a microlens of microlens array equals the inverse pitch, but this is not necessarily so.

In practice, the variables are determined in the following manner: the spot width is W$\propto(\lambda/L)$, the distance to the second order is S$\propto(\lambda/D)$; and the number of useful spots is N$\cong$L/D, where L represents the diameter of the input beam. As a further example of the physical area required to construct a micro-lens array, a 50 mm array is needed to construct a 1000 micro lenses where each micro lens is 50 $\mu$m.

Returning again to FIG. 1, inverse Fourier transform lens 110 is located adjacent to the spatial filter 100 at a side opposite the Fourier transform lens 90. The inverse Fourier transform lens 110 is operative to convert the filtered frequency component group from the frequency domain to the spatial domain. Since spatial filter 100 passes only the lowest frequency components group 120, the inverse Fourier transform lens 110 outputs a single beam that has a diameter of L.

It is noted that blocking the higher frequency component groups reduces the intensity of output beam 30 (in relation to input beam 20), but this reduction may be tolerated, as prior art light sources may provide strong light beams that may be utilized for inspection even after said power reduction. The following exemplary equation provides a rough estimation of the intensity loss, as other intensity losses occur, such as losses resulting from microlens array losses (resulting from underfilling of the microlens array pupil). Assuming that the microlenses are arranged in a periodical two dimensional array, the intensity reduction ratio substantially equals:

$$\frac{I2}{I1} = \frac{|\sin(kd\lambda/2D)|^2}{|(kd\lambda/2D)|} = \frac{|\sin(\pi d/D)|^2}{|(\pi d/D)|}$$

Whereas I1 is the intensity of the input beam 20, I2 is the intensity of the output beam 30. For a case where D=2d, the ratio I2/I1$\cong$0.4, which means that 40% of the light is lost by filtering out the high frequency components.

FIG. 3 illustrates a portion 130 of an optical inspection system that includes the scanning angle expander 10. Portion 130 includes: (i) light source, such as laser 140, (ii) beam expander and collimator 142, (iii) rotating mirror 146, (iv) mirror telescope 148, (v) scan angle expander 10, and (vi) focusing optics, such as objective lens 150. An inspected object 160, that is not a part of the optical system is shown in order to illustrate the overall path that the light beams and beamlets undergo.

Laser 140 generates a light beam 7 that is collimated and expanded by beam expander and collimator 142. Beam expander and collimator 142 has a conventional design, and expands and collimates beam 7 to form an incident beam 8 having a uniform intensity beam profile in a manner know in the art. The collimated incident beam 8 has a width that substantially equals L and impinges a rotating mirror 146 at an angle that changes during the scan period. The rotating mirror 146 reflects the incident beam 8 to provide a reflected beam 9 that is directed to mirror telescope 148. Reflected beam 9 is inclines in relation to the mirror telescope 148 in angles that range between $[-\theta_{IN}, +\theta_{IN}]$. The mirror telescope 148 (that may be implemented by a 1:1 magnification telescope) mirrors the reflected beam 9 to provide input beam 20. Graphically speaking, if incident beam is inclined by angle $+\alpha$ in relation to the input aperture of mirror telescope then input angle is inclined by an angle $-\alpha$ in relation to the output aperture of mirror telescope.

Mirror telescope 148 outputs input beam 20 with a diameter L and at an angle $\theta$ into the scanning angle expander 10, which further expands the scanning angle to a value of $(k\theta)$, where k is determined by the ratio of the focal lengths of the micro-lenses in the plural arrays, in accordance with the present invention. The output beam 30 of the scanning angle expander 10 has a diameter L. Thus, the output beam 30 maintains the same beam diameter size L of input beam 20 into the scanning angle expander 10, but has a lower intensity. The scanning angle has been expanded, however, from $2\theta$ to $k*2\theta$, in accordance with the present invention. The output beam 30 is provided to an objective lens 150, which has a focal length $f_0$. The objective lens 150 focuses the output beam onto the inspected object 160.

While this invention has been described in connection with what is presently considered to be the most practical and preferred embodiment, it is to be understood that the invention is not limited to the disclosed embodiment. Rather, it is intended to cover various modifications within the spirit and scope of the appended claims.

What is claimed is:

1. A scanning angle expander, comprising:
    converting optics for receiving an input beam, the input beam being inclined with respect with an optical axis of the converting optics by an input scan angle, and for converting the input beam to multiple output beamlets, each output beamlet being inclined with respect to the optical axis of the converting optics by an output scan angle; and
    expanding optics, for converting the multiple output beamlets to an output beam that is substantially parallel to the output beamlets, whereas the output beam and the input beam have substantially a same size.

2. The scanning angle expander according to claim 1 wherein the converting optics includes a microlens telescope.

3. The scanning angle expander of claim 2 wherein the microlens telescope comprises an first microlens array and an second microlens array that are positioned such that each microlens of the first microlens array corresponds to a second microlens of the second microlens array.

4. The scanning angle expander of claim 3 wherein the output scan angle is responsive to the input scan angle and to a ratio between a focal length of microlens of the first microlens array and a focal length of corresponding microlens of the second microlens array.

5. The scanning angle expander of claim 4 wherein a focal length of each microlens of the first microlens array is bigger than a focal length of the corresponding microlens of the second microlens array.

6. The scanning angle expander of claim 3 wherein the first microlens array comprises at least one row of microlenses.

7. The scanning angle expander of claim 3 wherein the first microlens array comprises at least one column of microlenses.

8. The scanning angle expander of claim 3 wherein at least two microlenses out of the microlenses of the first microlens array have the same focal length.

9. The scanning angle expander of claim 3 wherein at least two microlenses out of the microlenses of the second microlens array have the same focal length.

10. The scanning angle expander of claim 3 wherein the first microlens array has thousands of microlenses.

11. The scanning angle expander of claim 3 wherein each microlens of the first microlens array and a corresponding microlens of the second microlens array are separated by an axial distance substantially equal to a sum of a focal length of the microlens of the first microlens array and a focal length of the corresponding microlens of the second microlens array.

12. The scanning angle expander according to claim 3 wherein the microlenses of the second microlens array have a common focal length and are arranged in a plane oriented perpendicularly to the optical axis of the converting optics.

13. The scanning angle expander of claim 1 wherein the expanding optics is operable to convert the multiple output beamlets to an output beam by manipulations in the frequency domain.

14. The scanning angle expander according to claim 13 wherein the expanding optics is operable to convert a spatial light intensity distribution of the output beamlets in a first plane to a frequency representation of said spatial light intensity distribution in a second plane.

15. The scanning angle expander according to claim 14 wherein at least one spatial filter is positioned such as to pass at least one frequency component group out of the frequency representation, and to block at least one other frequency component group.

16. The scanning angle expander of claim 15 wherein the at least one spatial filter is operable to pass at least a portion of the lowest frequency component group.

17. The scanning angle expander of claim 15 wherein the at least one frequency component group that passes the at least one spatial filter is converted to a single output beam.

18. The scanning angle expander of claim 13 wherein the expanding optics comprises a Fourier transform lens operable to convert the spatial light intensity distribution of the output beamlets in a first plane to a frequency representation of said spatial light intensity distribution in a second plane.

19. A method for scanning angle expansion, the method comprising the steps of:
    (a) receiving an input beam by a converting optics, the input beam being inclined with respect with an optical axis of the a converting optics by an input scan angle;
    (b) converting the input beam to multiple output beamlets, each output beamlet being inclined with respect to the optical axis of the converting optics by an output scan angle; and
    (c) converting the multiple output beamlets to an output beam that is substantially parallel to the output beamlets, whereas the output beam and the input beam have substantially a same size.

20. The method according to claim 19 wherein step (b) includes passing the received input beam through a microlens telescope.

21. The method of claim 20 wherein the microlens telescope comprises a first microlens array and an second microlens array that are positioned such that each microlens of the first microlens array corresponds to a second microlens of the second microlens array.

22. The method of claim 21 wherein the output scan angle is responsive to the input scan angle and to a ratio between a focal length of a microlens of the first microlens array and a focal length of a corresponding microlens of the second microlens array.

23. The method of claim 21 wherein a focal length of the microlens of the first microlens array is bigger than a focal length of the corresponding microlens of the second microlens array.

24. The method of claim 21 wherein the first microlens array comprises at least one row of microlenses.

25. The method of claim 21 wherein the first microlens array comprises at least one column of microlenses.

26. The method of claim 21 wherein at least two microlenses out of the microlenses of the first microlens array have the same focal length.

27. The method of claim 21 wherein at least two microlenses out of the microlenses of the second microlens array have the same focal length.

28. The method of claim 21 wherein the first microlens array has thousands of microlenses.

29. The method of claim 21 wherein each microlens of the first microlens array and a corresponding microlens of the second microlens array are separated by an axial distance substantially equal to a sum of a focal length of the microlens of the first microlens array and a focal length of the corresponding microlens of the second microlens array.

30. The method according to claim 21 wherein the microlenses of the second microlens array have a common focal length and are arranged in a plane oriented perpendicularly to the optical axis of the converting optics.

31. The method of claim 19 wherein step (c) comprising manipulations in the frequency domain.

32. The method according to claim 19 wherein the manipulation comprising step (c.1) of converting a spatial light intensity distribution of the output beamlets in a first plane to a frequency representation of said spatial light intensity distribution in a second plane.

33. The method of claim 32 wherein step (c) further comprising step (c.2) of spatial filtering at the second plane.

34. The method of claim 33 wherein step (c.2) comprising passing at least one frequency component group and blocking at least one frequency component group.

35. The method of claim 34 wherein the step (c.2) comprising passing at least a portion of a lowest frequency component group and blocking other frequency component groups.

36. The method of claim 33 wherein step (c) further comprising step (c.3) of converting at least a portion of the at least one passed frequency component group to a single output beam.

37. The method of claim 32 wherein step (c.1) involves a Fourier transform.

38. The method of claim 36 wherein step (c.3) involving an inverse Fourier transform.

* * * * *